(12) United States Patent
Pajona et al.

(10) Patent No.: US 11,671,069 B2
(45) Date of Patent: *Jun. 6, 2023

(54) RF SIGNAL AGGREGATOR AND ANTENNA SYSTEM IMPLEMENTING THE SAME

(71) Applicant: Ethertronics, Inc., San Diego, CA (US)

(72) Inventors: Olivier Pajona, Antibes (FR); Laurent Desclos, San Diego, CA (US)

(73) Assignee: KYOCERA AVX Components (San Diego), Inc., San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/685,134

(22) Filed: Nov. 15, 2019

(65) Prior Publication Data

US 2020/0083858 A1 Mar. 12, 2020

Related U.S. Application Data

(63) Continuation of application No. 15/782,733, filed on Oct. 12, 2017, now Pat. No. 10,491,182.

(51) Int. Cl.
*H03H 7/24* (2006.01)
*H04B 1/00* (2006.01)
*H03J 3/08* (2006.01)
*H03H 7/00* (2006.01)
*H03H 7/46* (2006.01)

(52) U.S. Cl.
CPC ............... *H03H 7/24* (2013.01); *H03J 3/08* (2013.01); *H04B 1/006* (2013.01); *H04B 1/0064* (2013.01); *H03H 7/002* (2013.01); *H03H 7/463* (2013.01)

(58) Field of Classification Search
CPC .......... H03H 7/24; H03H 7/002; H03H 7/462; H04B 1/006; H04B 1/0064; H03J 3/08
USPC ....................................................... 333/81 R
See application file for complete search history.

(56) References Cited

U.S. PATENT DOCUMENTS 4,965,530 A * 10/1990 Katz ..................... H03F 1/0277
330/286
6,765,536 B2 7/2004 Phillips et al.
(Continued)

FOREIGN PATENT DOCUMENTS

| CN | 101523759 | 9/2009 |
| CN | 102342056 | 2/2012 |

(Continued)

OTHER PUBLICATIONS

PCT International Search Report and Written Opinion for corresponding PCT Application No. PCT/US2018/055129, dated Jan. 16, 2019—12 pages.

*Primary Examiner* — Hafizur Rahman
*Assistant Examiner* — Kimberly E Glenn
(74) *Attorney, Agent, or Firm* — Dority & Manning, P.A.

(57) ABSTRACT

The disclosure concerns a signal aggregator component designed to couple with an antenna element to form an antenna system, wherein the resulting antenna system can achieve one-hundred percent or greater efficiency in receiving mode. In addition, the antenna system can achieve specific polarization and gain in different sectors of the antenna radiation pattern. The signal aggregator functions to dynamically enable or disable any number of its RF ports to select the RF input signal to aggregate.

9 Claims, 5 Drawing Sheets

(56) References Cited

U.S. PATENT DOCUMENTS

| | | | |
|---|---|---|---|
| 6,954,173 B2 * | 10/2005 | Mrstik | H01Q 3/267 342/165 |
| 6,987,493 B2 | 1/2006 | Chen | |
| 7,068,234 B2 | 6/2006 | Sievenpiper | |
| 7,215,289 B2 | 5/2007 | Harano | |
| 7,830,320 B2 | 11/2010 | Shamblin | |
| 7,911,402 B2 | 3/2011 | Rowson et al. | |
| 8,362,962 B2 | 1/2013 | Rowson et al. | |
| 8,446,318 B2 | 5/2013 | Ali et al. | |
| 8,570,231 B2 | 10/2013 | Desclos | |
| 8,648,755 B2 | 2/2014 | Rowson et al. | |
| 8,717,241 B2 | 5/2014 | Shamblin et al. | |
| 9,240,634 B2 | 1/2016 | Rowson et al. | |
| 9,439,151 B2 | 9/2016 | Zhu et al. | |
| 10,491,182 B2 * | 11/2019 | Pajona | H04B 1/006 |
| 2005/0001760 A1 | 1/2005 | Mrstik | |
| 2006/0234627 A1 | 10/2006 | Cartin et al. | |
| 2010/0081410 A1 | 4/2010 | Kaido et al. | |
| 2011/0105055 A1 * | 5/2011 | Ilkov | H01P 1/15 455/93 |
| 2011/0260806 A1 | 10/2011 | Takeuchi | |
| 2012/0146742 A1 | 6/2012 | Caron et al. | |
| 2014/0127989 A1 | 5/2014 | Judd et al. | |
| 2014/0269449 A1 | 9/2014 | Abramsky et al. | |
| 2014/0368297 A1 | 12/2014 | Darwish | |
| 2017/0244432 A1 | 8/2017 | Ranta et al. | |

FOREIGN PATENT DOCUMENTS

| | | | |
|---|---|---|---|
| CN | 103607229 | 2/2014 | |
| CN | 106464621 | 2/2017 | |
| EP | 0986193 | 3/2000 | |
| EP | 986193 A1 * | 3/2000 | H04B 7/0851 |
| JP | 08084015 | 3/1996 | |
| JP | 2001332929 | 11/2001 | |
| JP | 2009200950 | 9/2009 | |
| JP | 2011097590 | 5/2011 | |
| JP | 2012521156 | 9/2012 | |
| JP | 2013009247 | 10/2013 | |
| JP | 2015084469 | 4/2015 | |
| JP | 2016208353 | 12/2016 | |
| WO | WO0152447 | 7/2001 | |
| WO | WO 2010/053131 | 5/2010 | |
| WO | WO 2016/043902 | 3/2016 | |

* cited by examiner

RF SIGNAL AGGREGATOR AND ANTENNA SYSTEM IMPLEMENTING THE SAME

PRIORITY CLAIM

This patent application is a continuation of U.S. patent application Ser. No. 15/782,733, filed on Oct. 12, 2017, titled "RF Signal Aggregator and Antenna System Implementing the Same," the disclosure of which is hereby expressly incorporated by reference as part of the present application as if fully set forth herein.

BACKGROUND

Antenna systems are widely implemented in conventional devices for connecting these devices to cellular networks, wireless local area networks, global positioning, and the like. These antenna systems generally function to receive signals at a receiver circuit ("reception" or "RX"), transmit signals at a transmitter circuit ("transmission" or "TX"), or both receive and transmit at a transceiver circuit.

The laws of physics dictate that a single passive antenna cannot exceed one-hundred percent efficiency (0 dB). A passive antenna, that is, an antenna with a fixed radiation pattern, cannot create energy, rather it may only shape that energy from one state to another.

However, if it were possible to circumvent the laws of physics, there is a significant need for an antenna system which achieves one-hundred-percent or greater efficiency, and such would be a groundbreaking innovation. There is further a need for such an antenna system which could maintain a specific polarization in different sectors of its radiation pattern.

SUMMARY

This disclosure concerns a radiofrequency (RF) signal aggregator component designed to couple with one or more antenna elements to form an antenna system, wherein the resulting antenna system can achieve one-hundred percent or greater efficiency in receiving (Rx) mode. In addition, the antenna system can achieve specific polarization and high gain in different sectors of the antenna radiation pattern.

The signal aggregator component generally comprises a plurality of transmission paths, each transmission path coupling a common port of the signal aggregator to one of a plurality of discrete ports thereof, such that each of the discrete ports is coupled to the common port via a distinct transmission path extending therebetween. The signal aggregator further comprises an RF signal bus wherein at the RF signal bus each of the transmission paths may be aggregated. Further implemented between each discrete port and the RF signal bus may be an RF reflective isolator that can be a complementary metal-oxide-semiconductor (CMOS) component or a ferromagnetic material based component. The reflective isolator serves to prevent undesired feedback in the direction of a respective discrete port, and an antenna element configured to be coupled therewith.

Alternatively, each of the reflective isolators may individually be implemented as a multi-port RF circulator, a diode; transistor; coupler, amplifier; or gyrator.

In addition, one or more sub-components may be implemented for matching one or more of the discrete ports and the common port, respectively, the sub-components may be individually selected from: a switch, tunable capacitor, tunable inductor, transistor, other voltage-controlled tunable components, and the like as would be appreciated by one having skill in the art.

In this regard, the signal aggregator functions to dynamically enable or disable any number of its discrete RF ports to select one or more of the RF input signals of the discrete ports, respectively, to aggregate.

In another aspect of the invention, an antenna system is disclosed comprising one or more RX sub-antennas and up to any number of TX sub-antennas, each RX sub-antenna being coupled to an RF signal aggregator component as disclosed herein. In this regard, each of the RX sub-antennas can be designed with distinct polarization, gain, radiation pattern, and frequency band resonances. As such, the antenna system is capable of being constructed to have radiation pattern properties that would not be achievable with classical passive antenna designs. For example, a circular polarization could be achieved in all directions with an antenna system implementing a plurality of circularly polarized antennas and an RF signal aggregator, whereas a passive antenna can only achieve a circular polarization in a few parts of its radiation pattern.

In some embodiments, one or more of the sub antennas may comprise an active multi-mode beam-steering/null-steering antenna (herein referred to as a "modal antenna") Examples of modal antennas are described in commonly owned U.S. Pat. Nos. 9,240,634; 8,648,755, 8,362,962; and 7,911,402, the entire contents of each of which are hereby incorporated by reference.

In yet another aspect, a method is disclosed for aggregating signals using the RF signal aggregator component or an antenna system implementing the same.

Other features and advantages are herein described in the appended detailed description.

DETAILED DESCRIPTION

In furtherance of the details provided above, the following description is provided to enable one having skill in the art to appreciate, make and use the invention as described and distinctly claimed herein. Because the specific combinations of individual features would yield a large number of practical embodiments within which the invention may be practiced, and in the interest of providing the reviewer with a reasonably clear and concise description, only the preferred embodiments will be presented to herein. However, it should be recognized that other embodiments which are not explicitly described herein can be similarly practiced without undue experimentation by one having the ordinary level of skill in the art. As such, any assessment concerning scope of the invention should be directed to the claims as distinctly provided herein, and interpreted considering this specification in its broadest reasonable interpretation and taken into consideration the ordinary level of knowledge and skill in the art Nothing in this description is intended to be limiting as to the spirit and scope of the invention.

Now, as indicated above, this disclosure concerns a radiofrequency (RF) signal aggregator component designed to couple with one or more antenna elements to form an antenna system, wherein the resulting antenna system can achieve one-hundred percent or greater efficiency.

In addition, the antenna system can achieve specific polarization and gain in different sectors of the antenna radiation pattern.

The RF signal aggregator may function to dynamically enable or disable any number of its RF pons to select the RF input signal to aggregate.

The RF signal aggregator is preferably manufactured as an integrated circuit or monolithic integrated circuit (also referred to as an IC, a chip, or a microchip), which is generally a set of electronic circuits on one small flat piece (or "chip") of semiconductor material, normally silicon. However, it is possible to implement the RF signal aggregator as a printed or other circuit in accordance with the ordinary level of skill in the art.

The RF signal aggregator, and the antenna system implementing the same, can achieve super-efficient performance on the receive side, for example 0 dB.

The RF signal aggregator is generally not applied to the transmission side of the antenna system; however, an antenna system implementing the RF signal aggregator on the receive side may further implement conventional transmit antennas, for example, with the integration of a duplexer or other technique known to one with skill in the art. In this regard, such an antenna system may implement RF signal aggregation using the RF signal aggregator component, and may further support transmission function.

The RF signal aggregator generally comprises a plurality of transmission paths, each transmission path coupling a common port of the signal aggregator to one of a plurality of discrete pons thereof, such that each of the discrete ports is coupled to the common port via a distinct transmission path extending therebetween. The signal aggregator further comprises an RF signal bus, wherein at the RF signal bus each of the transmission paths may be aggregated and further directed to the common port. Further implemented between each discrete port and the RF signal bus may be a reflective isolator, such as, for example, a complementary metal-oxide-semiconductor (CMOS) RF reflective isolator or a ferrite based reflective isolator. The reflective isolator serves to prevent undesired feedback signal in the direction of a respective discrete port, and an antenna element configured to be coupled therewith.

The RF signal aggregator component may comprise a common port and at least two but up to any number "n" discrete ports. Each of the discrete ports is configured to couple a respective antenna element Each antenna element therefore may obtain a distinct receive signal, and may then communicate the distinct receive signal through the respective discrete port. Each distinct receive signal passes through a reflective isolator, or equivalent sub-component or circuit, for preventing undesired feedback. The distinct signals of each discrete RF port can then be aggregated at the RF signal bus and coupled to the common port for connecting to a receiver or transceiver.

In some embodiments, a switch or other sub component is implemented, and the RF signal aggregator component is adapted to isolate a single transmission path, discrete port and antenna element, such that the isolated path and antenna element may be utilized for signal transmission. Note that in such embodiments, signal aggregation is not performed, rather, the component is configured in reverse to provide a single transmission path (non-aggregated) to transmit a signal. In other embodiments, the RF signal aggregator is not utilized in any state for the purpose of transmission, and instead the signal aggregator component is implemented for receive function only.

For example, in some embodiments, the common port can be labeled a first port (P1), whereas the discrete pons may be labeled as the second port (P2), . . . , thru $n^{th}$ port (PN). Each combination of P2P1; P3P1; P4P1; . . . ; PNP1 represents a single path (non-aggregated) between the common port and one of the distinct RF ports, and such path and corresponding configuration can be used for transmission function.

It may be desirable to couple a passive antenna element to each respective discrete RF port of the RF signal aggregator. In this regard, the combination of passive elements can provide a distinct polarization in each sector of the radiation pattern, a benefit which cannot be achieved with a single passive antenna element.

Alternatively, any one or more of the receive antenna elements and transmit antenna elements may comprise an active multi-mode null-steering/beam-steering antenna element, otherwise known in the art as a modal antenna. The active multi-mode antenna element may further comprise a baud switching antenna; an active impedance matching antenna for adjusting to detuning effects; or a beam-steering/null-steering antenna.

Figure 1:
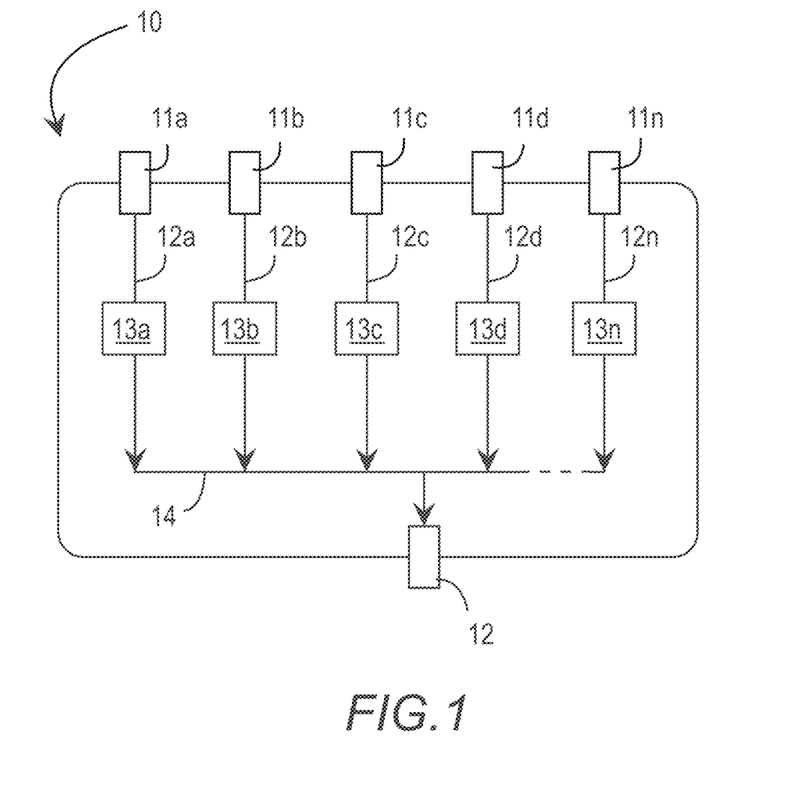
FIG. 1 shows an RF signal aggregator in accordance with an embodiment.

Now, turning to the drawings, FIG. 1 shows an RF signal aggregator component 10 in accordance with an embodiment. The signal aggregator component 10 comprises a common port 12 and a plurality of discrete RF ports 11$a$; 11$b$; 11$c$; 11$d$; . . . ; 11$n$. While five discrete ports are illustrated, the signal aggregator component may comprise as few as two discrete ports, or as many discrete ports as may physically fit on the component itself, i.e. can be dozens, scores, or even hundreds of discrete pons Here, each of the five discrete ports 11($a$-$d$, . . . , $n$) is connected to a distinct transmission path 12($a$-$d$, . . . , $n$), respectively. Each transmission path is coupled to a signal bus 14, and the signal bus is connected to the common port 12. A sub-component 13$a$; 13$b$; 13$c$; 13$d$; . . . ; 13$n$ is coupled to each transmission path 12($a$-$d$, . . . , $n$), respectively.

The sub-component 13($a$-$d$, . . . , $n$) may preferably comprise a CMOS RF one-way reflective isolator. Alternatively, the sub-component may comprise, a three-port or four port RF circulator; isolator, diode; transistor, coupler, amplifier; or gyrator.

While not shown in FIG. 1, the RF signal aggregator component may additionally comprise one or more impedance matching techniques or devices to compensate the impedance at the respective discrete ports of the component. In this regard, matching each discrete port may achieve optimal power transfer.

In addition, the common port may be modified with an impedance matching technique or device to compensate the impedance at the common port of the component. In this regard, matching the common port may achieve optimal power transfer through the component.

In some embodiments, not shown in FIG. 1, the RF signal aggregator component may further comprise an embedded a duplexer, circulator, and/or switch to separate receive and transmit streams.

Figure 2:
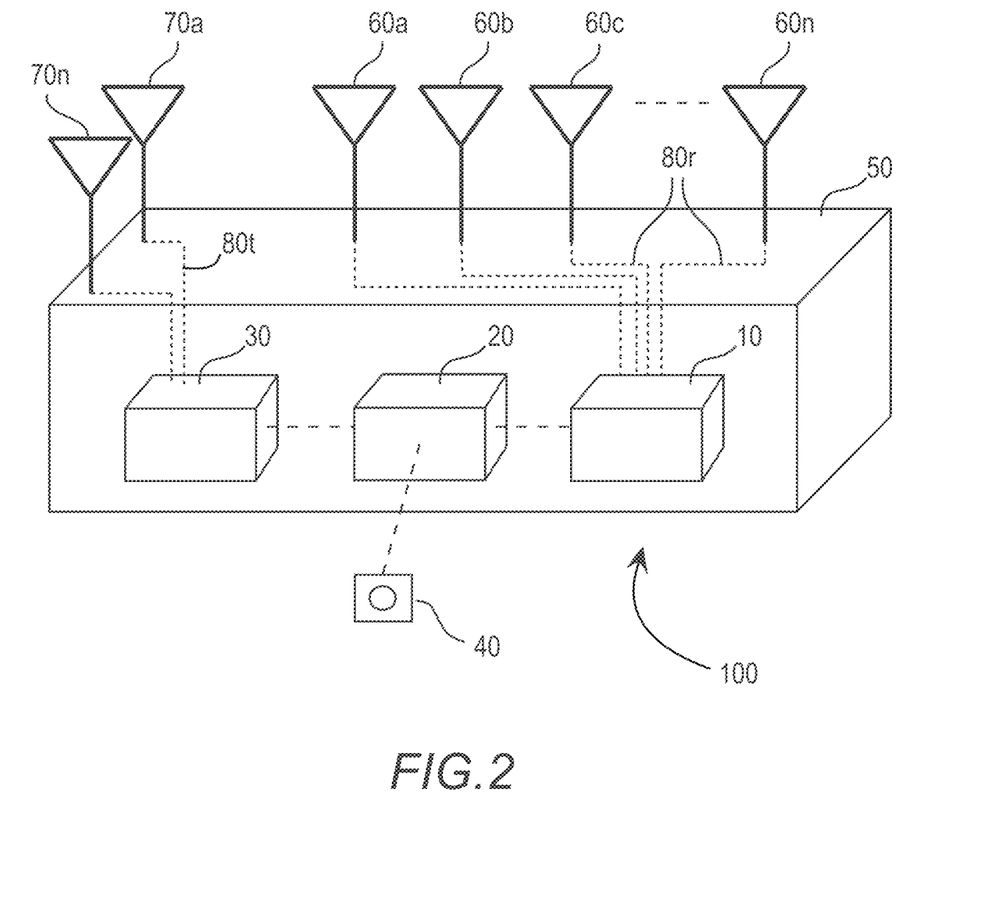
FIG. 2 shows an antenna system configured for transmit and receive function, the antenna system implementing an RF signal aggregator in accordance with another embodiment.

FIG. 2 shows an antenna system 100 configured for transmit and receive function, the antenna system is shown implementing an RF signal aggregator 10. Here, the antenna system may house an RF duplexer or circulator 20, such as for example a three-port circulator, which is further coupled to each of: (i) an RF switch 30 and one or more transmission sub-antenna elements 70a; 70b connected therewith, and (ii) an RF signal aggregator component 10 and a plurality of receive sub-antenna elements 60a; 60b; 60c; . . . ; 60n connected therewith. RX transmission lines 80r, and TX transmission lines 80t are illustrated. The circulator or duplexer is shown being further coupled to an RF connector 40 for further connecting with a transceiver.

The RF signal aggregator component may contain or embed in its volume an RF switch, duplexer or circulator, and/or other sub-components therein. Alternatively, as shown, the RF signal aggregator component forms an individual and distinct component that is coupled with an external RF switch, duplexer or circulator, and other components, the combination of which may be commonly housed in an antenna system module.

The antenna system which comprises a plurality of receive sub-antenna elements coupled to the RF signal aggregator may comprise distinguished antenna elements, that is, each of the receive antenna elements may individually comprise distinct polarization, gain, radiation pattern, and resonant frequencies associated therewith. The receive sub-antenna elements may be the same, or may comprise distinct antennas altogether.

Accordingly, it is possible for the antenna system to comprise radiation pattern properties that would not be achievable with classical passive antenna design, for example, circular polarization could be achieved in all directions, whereas a passive antenna can merely achieve circular polarization in only a few sectors of its radiation pattern.

Figure 3:
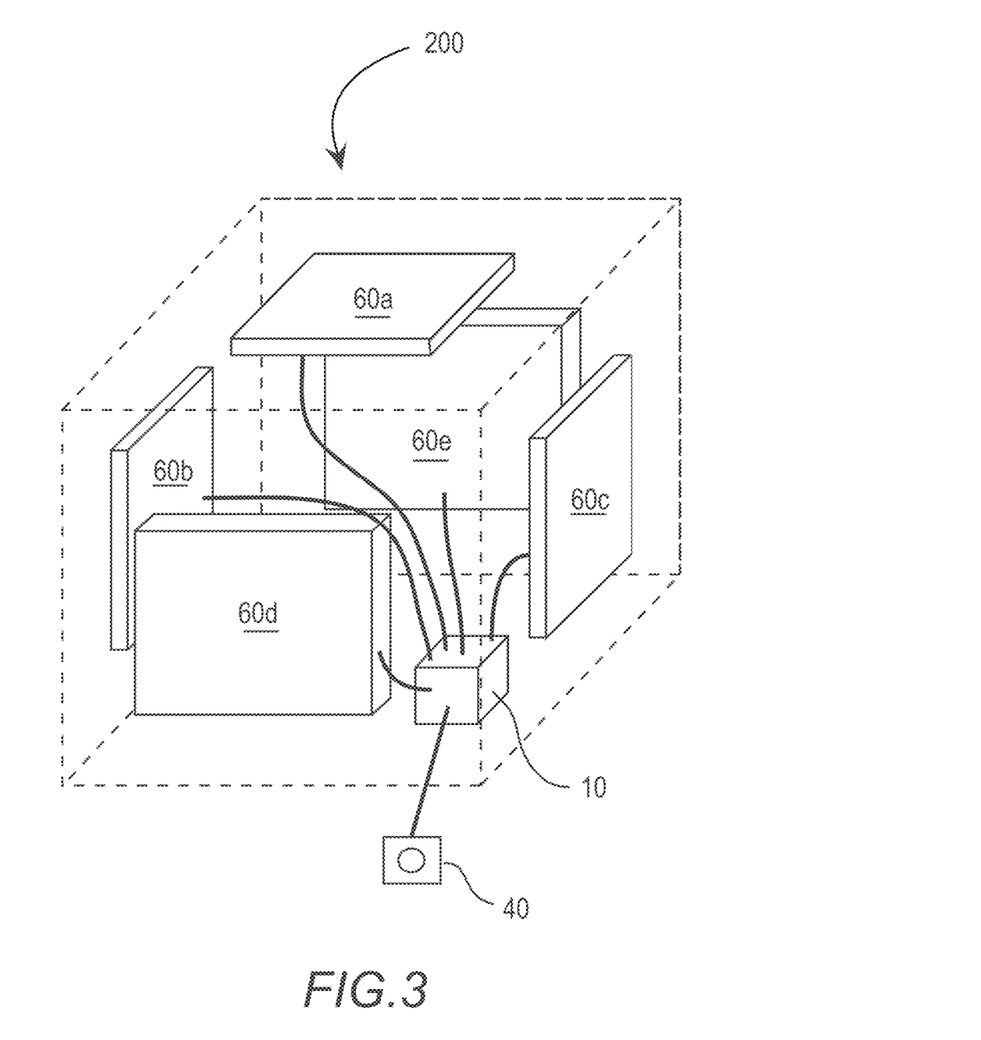
FIG. 3 shows an antenna system configured for receive function only, the antenna system implementing an RF signal aggregator in accordance with yet another embodiment.

FIG. 3 shows an antenna system 200 configured for receive function only, the antenna system implementing an RF signal aggregator 10 in accordance with yet another embodiment. Here, the receive antenna system 200 comprises five RX antenna elements, including: a first antenna element 60a positioned on a top surface of a module for implementing the antenna system, a second RX antenna element 60b and third RX antenna element 60c each positioned on opposite sides (left and right, respectively), and fourth and fifth RX antenna elements 60d; 60e, respectively, being positioned at a front side and rear side of the antenna system module. Each of the RX antennas is coupled to a discrete RF port of the RF signal aggregator component 10. The component 10 is further coupled to an RF connector at the common port.

While the five antennas are shown positioned on multiple sides of a modular antenna system, it is possible to provide the antennas without a common volume or module; i.e. the antennas can be interconnected with supports or otherwise as would be appreciated by one with skill in the art.

Figure 4:
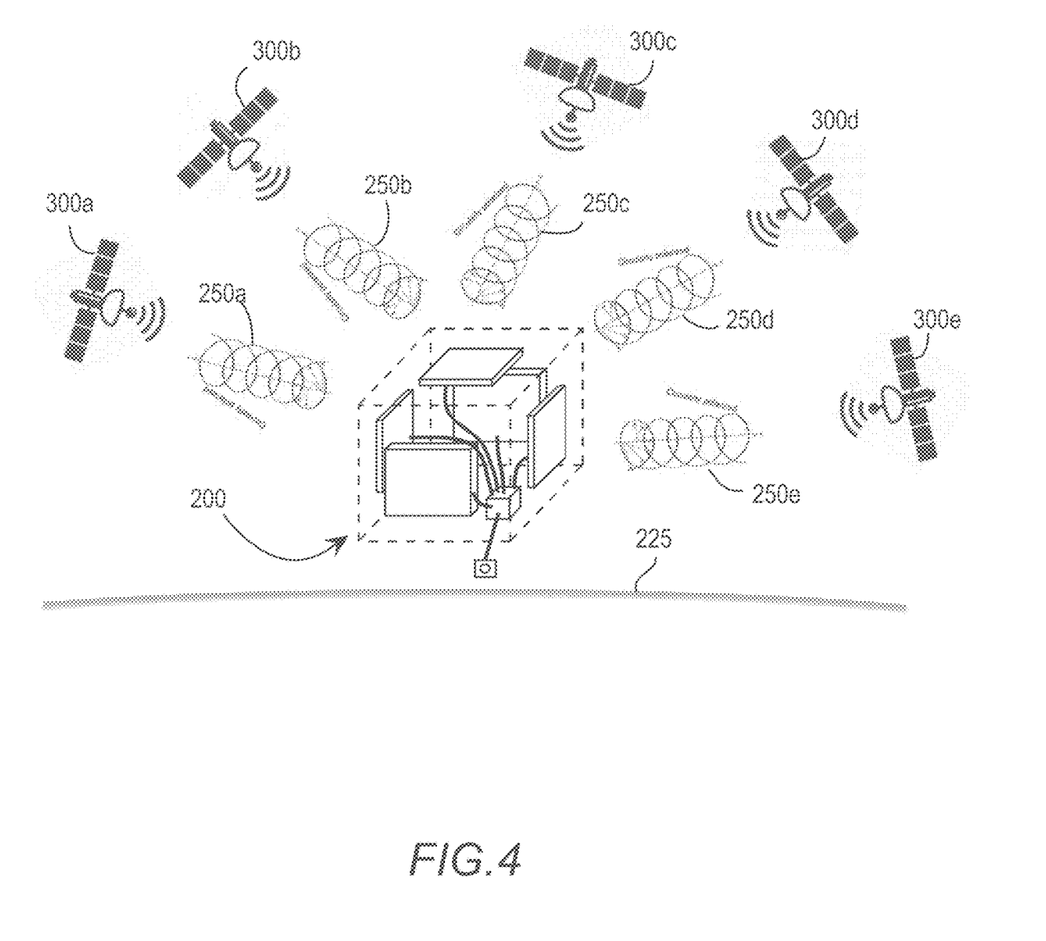
FIG. 4 shows the antenna system of FIG. 3 configured with multiple distinct polarizations for communicating with a plurality of sources on a GPS or GLONASS network.

FIG. 4 shows the antenna system 200 of FIG. 3 configured with multiple distinct polarizations 250a; 250b; 250c, 250d, and 250e for communicating with a plurality of sources, here satellites 300a; 300b; 300c; 300d; and 300e, respectively, on a GPS or GNSS network. The antenna system is positioned above a ground horizon 225, and due to the plurality of antenna elements may concurrently receive signals from a plurality of satellites in the open sky. Accordingly, by using the antenna system shown and the disclosed RF signal aggregator component, it is possible to capture, concurrently (at the same time), signals from different GPS/GNSS satellites positioned all over the sky.

Figure 5:
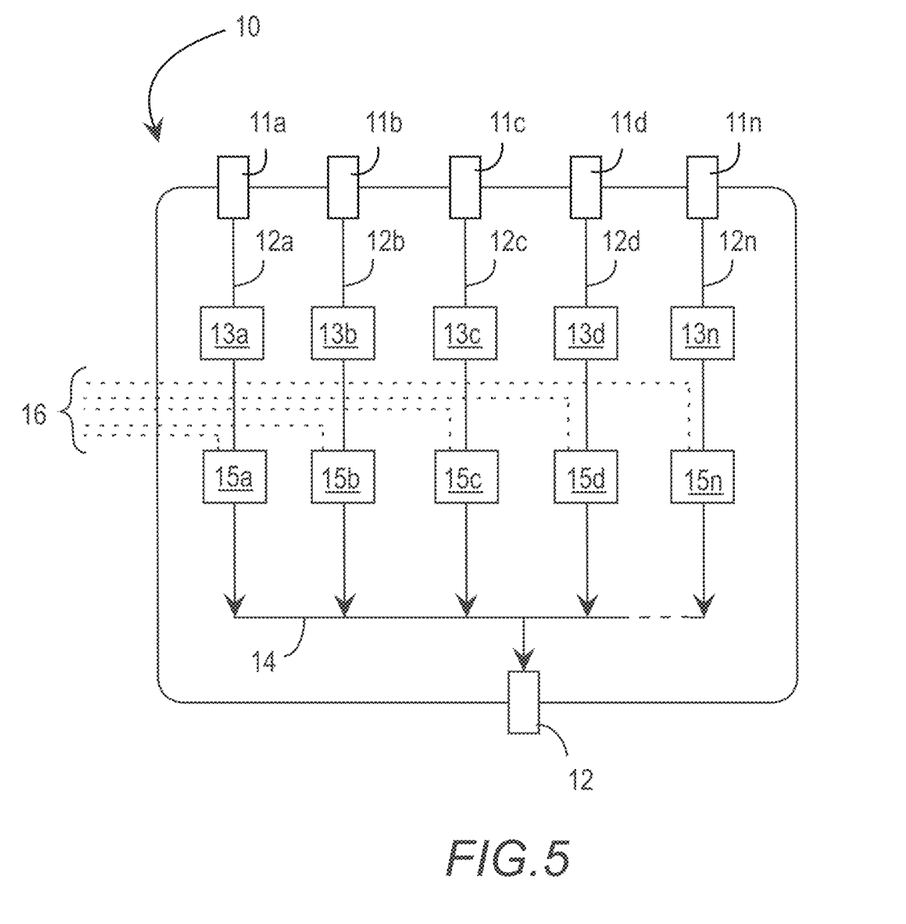
FIG. 5 shows an RF signal aggregator with active components for enabling/disabling transmission paths for aggregating and/or for tuning an impedance of each distinct RF port, respectively.

FIG. 5 shows an RF signal aggregator in accordance with another embodiment, wherein the signal aggregator component comprises active components 15a, 15b; 15c, 15d; . . . ; 15n for enabling/disabling transmission paths for aggregating and/or for tuning an impedance of each distinct RF port, respectively. For example, the active components may comprise control lines 16, wherein a processor can control signals sent to the active components, such as voltage signals, for reconfiguring a state of each of the active components in real time. Here, the state of the active components can be controlled individually to vary a tuning state, for example impedance state, or to vary an "on"/"off" characteristic, for example where the active component is a switch. Accordingly, the impedance can be matched or the transmission path can be enabled/disables, depending on control signals provided and the type of active component implemented. Examples of active components may include any voltage controlled tunable reactance component, or switch, or may include a solid-state device, diode, transistor, or other voltage controlled tunable component.

In yet another application, the antenna system implementing a plurality of receive antennas coupled to a signal aggregator component as disclosed herein may be used to obtain signal in VHF/UHF/FM bands.

We claim:

1. A radio frequency (RF) signal aggregator, comprising:
a common port;
a plurality of discrete ports, each of the plurality of discrete ports coupled to the common port;
a plurality of sub-components, each of the plurality of sub-components coupled between the common port and a corresponding discrete port of the plurality of discrete ports;
a plurality of active components, each of the plurality of active components coupled between the common port and a corresponding sub-component of the plurality of sub-components;
an RF signal bus coupled between the common port and each of the plurality of active components;
wherein the plurality of sub-components comprise a circulator, isolator, diode, transistor, or gyrator.

2. The RF signal aggregator of claim 1, further comprising:
a plurality of transmission paths, each of the plurality of transmission paths coupling the common port to a corresponding discrete port of the plurality of discrete ports.

3. The RF signal aggregator of claim 2, wherein each of the plurality of sub-components is coupled to a corresponding transmission path of the plurality of transmission paths.

4. An antenna system, comprising:
a plurality of receive antenna elements; and
a radio frequency (RF) signal aggregator comprising:
a common port;
a plurality of discrete ports, each of the plurality of discrete ports coupled between the common port and a corresponding receive antenna element of the plurality of receive antenna elements;
a plurality of sub-components, each of the plurality of sub-components coupled between the common port and a corresponding discrete port of the plurality of discrete ports;

a plurality of active components, each of the plurality of active components coupled between the common port and a corresponding sub-component of the plurality of sub-components;
an RF connector; and
an RF duplexer coupled between the RF connector and the RF signal aggregator.

5. The antenna system of claim 4, further comprising:
a plurality of transmit antenna elements; and
a RF switch coupled between the RF duplexer and the plurality of transmit antenna elements.

6. The antenna system of claim 5, wherein at least one of the plurality or receive antenna elements or the plurality of transmit antenna elements comprises an active multi-mode antenna element.

7. The antenna system of claim 4, wherein the RF signal aggregator further comprises:
a plurality of transmission paths, each of the plurality of transmission paths coupling the common port to a corresponding discrete port of the plurality of discrete ports.

8. The antenna system of claim 7, wherein each of the plurality of sub-components is coupled to a corresponding transmission path of the plurality of transmission paths.

9. A radio frequency (RF) signal aggregator, comprising:
a common port;
a plurality of discrete ports, each of the plurality of discrete ports coupled to the common port;
a plurality of sub-components, each of the plurality of sub-components coupled between the common port and a corresponding discrete port of the plurality of discrete ports; and
a plurality of active components, each of the plurality of active components coupled between the common port and a corresponding sub-component of the plurality of sub-components;
wherein at least one of the plurality of sub-components comprises a CMOS RF reflective isolator or a ferrite based reflective isolator.

* * * * *